| United States Patent [19] | [11] Patent Number: 4,724,339 |
|---|---|
| Ishida | [45] Date of Patent: Feb. 9, 1988 |

[54] LOW ELECTRIC POWER CONSUMPTION VOLTAGE COMPARISON DEVICE

[75] Inventor: Hiroshi Ishida, Tokyo, Japan

[73] Assignee: Fanuc Ltd., Yamanashi, Japan

[21] Appl. No.: 887,403

[22] PCT Filed: Nov. 12, 1985

[86] PCT No.: PCT/JP85/00631

§ 371 Date: Aug. 12, 1986

§ 102(e) Date: Aug. 12, 1986

[87] PCT Pub. No.: WO86/03012

PCT Pub. Date: May 22, 1986

[30] Foreign Application Priority Data

Nov. 12, 1984 [JP] Japan ................ 59-236643

[51] Int. Cl.$^4$ .......... H03K 5/153; H03K 5/24
[52] U.S. Cl. ................ 307/362; 307/296 R; 307/355; 330/51; 330/252
[58] Field of Search .......... 307/362, 355, 356, 296 R; 330/51, 252

[56] References Cited

U.S. PATENT DOCUMENTS

| 4,004,158 | 1/1977 | Morgan | 307/362 |
| 4,309,627 | 1/1982 | Tabata | 307/362 |
| 4,461,964 | 7/1984 | Shiotari | 307/362 |

*Primary Examiner*—John Zazworsky
*Attorney, Agent, or Firm*—Armstrong, Nikaido, Marmelstein & Kubovcik

[57] ABSTRACT

Electric current supply circuits (23), (24) each having a switching element are inserted at an electric power supply side (31) and at an electric power return side (32) of a differential amplification means (10) in a voltage comparison device, and the electric current supply circuits having the switching element are controlled to turn ON/OFF. Thus, a voltage comparison device with a low electric power consumption and a high speed intermittent operation can be achieved.

4 Claims, 7 Drawing Figures

Fig. 1
Fig. 2
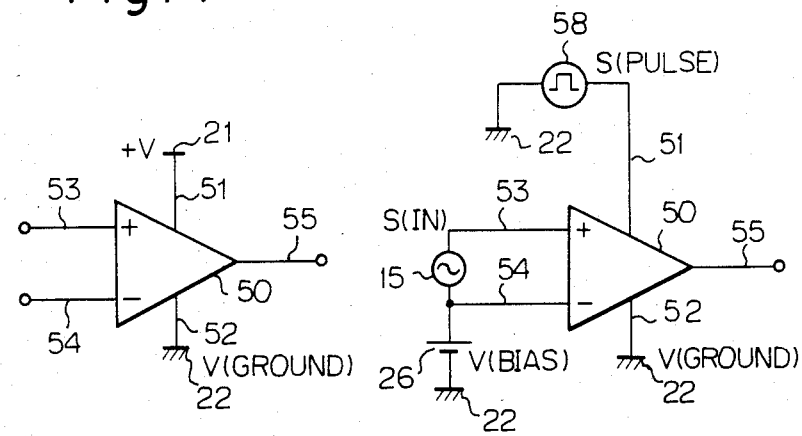
Fig. 3
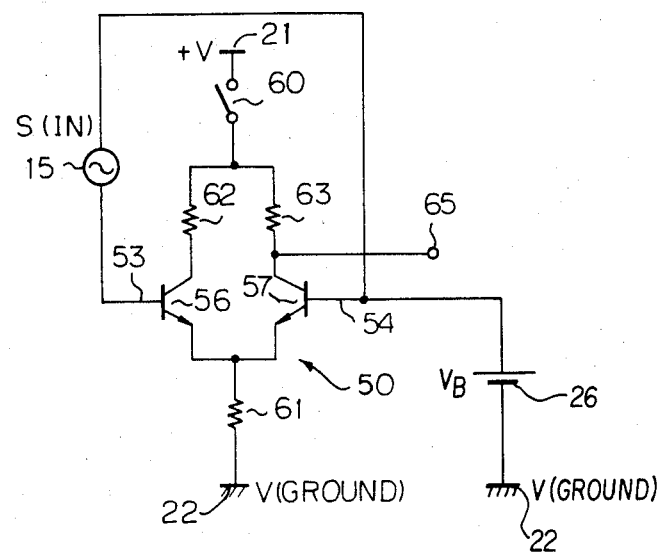

LOW ELECTRIC POWER CONSUMPTION VOLTAGE COMPARISON DEVICE

TECHNICAL FIELD

The present invention relates to a low electric power consumption voltage comparison circuit utilized in an electronic circuit for a pulse encoder or the like.

BACKGROUND ART

A conventional voltage comparison device using a differential amplification circuit is shown in FIG. 1, FIG. 2, and FIG. 3. In FIG. 1, an operational amplifier 50 as a voltage comparison device is shown. The operational amplifier 50 is supplied with an electric power from a +V electric power source 21 through an electric power supply feeder 51, and the electric power returns to a negative terminal 22 (usually ground potential) of the power source through an electric power return feeder 52. Also, an input signal S(IN) is supplied to a noninverting input terminal 53 and an inverting input terminal 54, and the output is obtained at an output terminal 55. Such a voltage comparison device as an operational amplifier which is usually part of an integrated circuit has a problem in that the device has a comparatively large electric power consumption since it includes the differential amplification circuit. Particularly, when the electric power is supplied with a cell or the like to the above circuit, the effect is remarkable. For this reason, as shown in FIG. 2, a circuit is known wherein the electric power is supplied as a pulse S (PULSE) only when the voltage comparison is performed. In this example, an input signal 15 as an input is applied between the noninverting input terminal 53 and the inverting input terminal 54, and a bias voltage V (BIAS) from a bias source 26 is applied to the inverting input terminal 54. The circuit diagram of the portion of the differential amplification circuit in this circuit is shown in FIG. 3. In an example of this circuit, the differential amplification circuit is constituted with two transistors 56 and 57 connected to each other at their emitters, resistors 62 and 63 connected to the collectors of the transistors 56 and 57, respectively, and a resistor 61 connected to the emitters of the transistors 56 and 57. A switch 60 inserted in the electric power supply feed circuit turns the voltage of the electric power source 21 ON or OFF, the voltage comparison circuit operates intermittently, and the output is obtained at a terminal 65. If the circuits as shown in FIG. 2 and FIG. 3 are used, the electric power consumption can be suppressed to a low value.

In the circuits of FIG. 2 and FIG. 3, however, when the switch is made to turn OFF the supply of electric power intermittently, almost all of the circuits are reduced to the potential of the return side of the electric power source, that is, usually ground potential. In the next step when the switch turns ON to operate the voltage comparison, a high speed rise to a required potential cannot be performed as a certain time lag is necessary, and thus a high speed intermittent operation is difficult.

DISCLOSURE OF THE INVENTION

An object of the present invention is to obtain a voltage comparison device by which it is possible to consume a low electric power and to operate intermittently at a high speed, based on an idea wherein the voltage comparison device comprises electric current switch circuits at the electric power supply side and at the electric power return side for a differential amplification means therein and the switch circuits turn ON and OFF intermittently.

In the present invention, there is provided a voltage comparison device which comprises a differential amplification means having a noninverting input terminal and an inverting input terminal, for differentially amplifying an input signal and for generating an output signal; a first and a second voltage source; an electric power supply feeder for connecting between the differential amplification means and the first voltage source; an electric power return feeder for connecting between the differential amplification means and the second voltage source; a first electric current supply circuit (electric current switch) having a switching element and inserted in the middle of the electric power supply feeder; and a second electric current supply circuit (electric current switch) having a switching element and inserted in the middle of the electric power return feeder; and wherein the first and the second electric current supply circuits having the switching elements are ON/OFF controlled.

As mentioned above, if the electric current switch circuits are provided at the electric power supply side and the electric power return side of the differential amplification means in the voltage comparison device, and the electric power is intermittently supplied only at the necessary time by conducting the electric current switches, the electric power consumption can be reduced. Also, the differential amplification circuit turned OFF and disconnected by the two electric current switches is in a floating condition, thus when it is switched to the operating condition by turning ON the electric current switches, a high speed response and a high speed intermittent operation can be achieved.

BRIEF EXPLANATION OF DRAWINGS

FIG. 1 and FIG. 2 are circuit diagrams of conventional voltage comparison devices;

FIG. 3 is a circuit diagram of a differential amplification portion according to a conventional voltage comparison device operating intermittently;

BEST MODE FOR CARRYING OUT THE INVENTION

Figure 4:
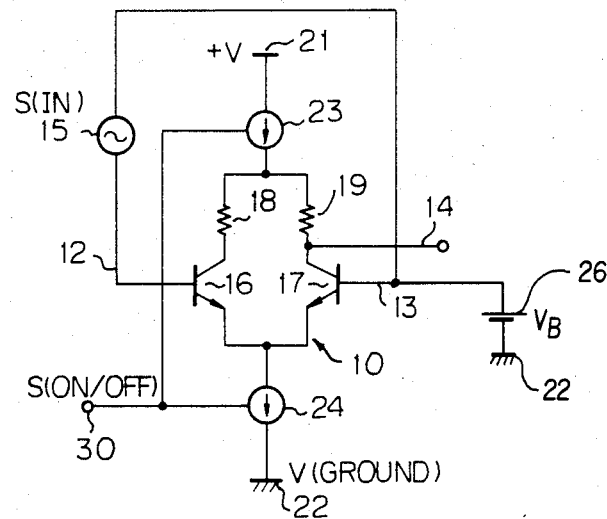
FIG. 4 is a circuit diagram of a differential amplification circuit and the peripheral portion thereof in a low electric power consumption voltage comparison device according to an embodiment of the present invention.
Figure 5:
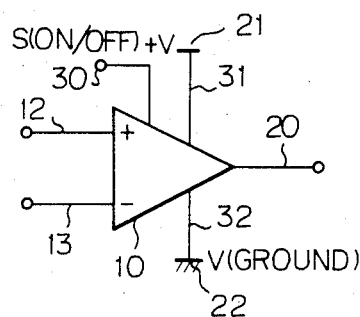
FIGS. 5 and FIG. 6 are circuit diagrams of the low electric power consumption voltage comparison device in FIG. 4; and, FIG. 7 is a circuit diagram according to another embodiment of the present invention.

A low electric power consumption voltage comparison device according to an embodiment of the present invention is shown in FIG. 4 and FIG. 5. In FIG. 5, an electric current supply circuit is provided in an operational amplifier type differential amplification circuit, which constitutes the voltage comparison device and can be turned ON or OFF by applying a control signal S (ON/OFF) to a newly provided terminal 30 for switching from an external side. The electric current switches are inserted in the electric power supply side and the electric power return side in the differential amplification circuit 10, and the electric power source of the differential amplification circuit can be connected or disconnected as necessary.

In the circuit of FIG. 5, an input is applied to a noninverting input terminal 12 and an inverting input terminal 13, and an output is obtained at an output terminal 20. A voltage from +V electric power source 21 as a first electric power source is supplied through an electric power supply feeder 31. The electric power return feeder 32 is connected to a ground potential V (GROUND) at a ground point 22.

Figure 6:
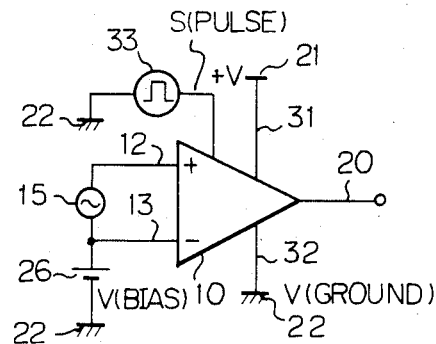

FIG. 6 is a diagram corresponding to the above-mentioned FIG. 2. An input signal 15 to be operated is applied between input terminals in the circuit of FIG. 6 and the inverting input terminal 13 is connected to an electric power source 26 for supplying the bias voltage V (BIAS). The control signal S (ON/OFF) is applied to the terminal 30 for switching. The differential amplification circuit 10 is the same as that in FIG. 6.

In FIG. 4, the circuit diagram of the differential amplification circuit and the peripheral portion thereof is shown. The differential amplification circuit 10 comprises transistors 16 and 17 and resistors 18 and 19 connected to the collectors of the transistors 16 and 17, respectively. The emitters of the transistors 16 and 17 are connected to each other. The base of the transistor 16 is connected to the noninverting input terminal 12 and the base of the transistor 17 is connected to the inverting input terminal 13. The electric power from the +V electric power source 21 is connected to the terminals of the resistors 18 and 19, which are not connected to the transistors 16 and 17, through an electric current switch 23.

The emitters of the transistors 16 and 17 are grounded through another electric current switch 24. Control terminals through which the electric current switches 23 and 24 are controlled to turn ON or OFF are connected to the terminal 30 for switching. The collector of the transistor 17 is connected to an output terminal 14. The connections regarding the input signal 15 and the electric power source 26 for the bias voltage are substantially the same as those in the circuit of FIG. 3. For example, a transistor circuit constituting a constant-current circuit can be used as the electric current switches 23 and 24.

If the electric current switches are switched from an OFF state to an ON state, since the differential amplification circuit 10 is in a floating state at the OFF state, the voltage of each portion of the circuit quickly reaches the normal state in the operating condition by using the above-mentioned differential amplification circuit 10. Therefore, a high speed intermittent operation can be carried out.

Figure 7:
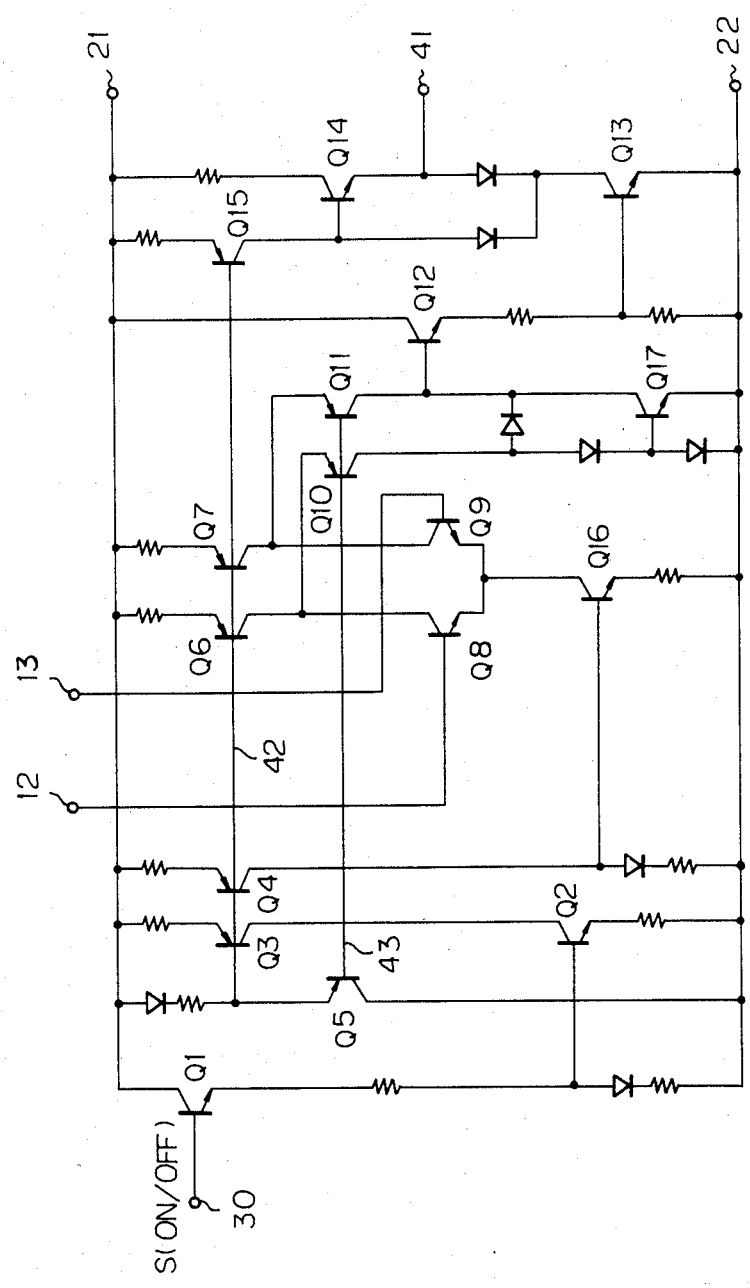

In FIG. 7, a circuit diagram of a low electric power consumption voltage comparison device according to another embodiment of the present invention is shown. The device of FIG. 7 comprises transistors Q1 to Q17 The transistors Q1 to Q7, Q15, and Q16 are used for electric current switching.

The electric power source 21 usually supplies +5 volts and one terminal is connected to the ground 22. The transistor Q1 is made conductive or nonconductive by receiving the external ON or OFF signal for switching. The transistor Q1 is made conductive by receiving +5 volts at the base thereof and the transistor Q2 is also made conductive, whereby the transistor Q5 becomes conductive. Then a connecting point 42 to which the bases of the transistors Q3, Q4, Q6, Q7, and Q15 are connected is set at approximately +4.4 volts, which is about 0.6 volts lower than +5 volts. Simultaneously, a connecting point 43 connected to the base of the transistor Q5 and the collector of the transistor Q3 is set at approximately +3.8 volts, which is about 1.2 volts lower than +5 volts. Also, the base of the transistor Q16 is set at approximately +0.6 volts. Thus, all of the transistors for electric current switching become conductive, and moreover, the transistors Q10, Q11, and Q14 are made conductive.

As mentioned above, when the transistor Q1 is conductive, the transistors for electric current switching become conductive, the electric power is supplied to a differential amplification circuit constituted with the transistors Q8 and Q9, and is supplied to the transistors Q10, Q11, and Q17, which constitute the circuit for taking out the output from the differential amplification circuit. The differential amplification circuit receiving the supply of the electric power receives an input at terminals 12 and 13 and supplies the output to an output terminal 41 through the collector of the transistor Q17 and a power amplification circuit comprising the transistors Q12, Q13, and Q14.

In the device of FIG. 7, when the ON signal is not applied to the terminal 30 for switching, little electric power is consumed, and when the ON signal is applied, each portion is quickly set at the potential in the operation state. Thus, a high speed intermittent operation can be performed. In addition, the transistor Q17 and a diode connected to the base thereof constitute a current-mirror circuit.

I claim:

1. A voltage comparison device comprising:
    a differential amplification means having a noninverting input terminal and an inverting input terminal, for amplifying differentially an input signal and for generating an output signal;
    a first and a second voltage sources;
    an electric power supply feeder line for connecting said differential amplification means to said first voltage source;
    an electric power return feeder line for connecting said differential amplification means to said second voltage source;
    a first electric current supply circuit having a switching element, and interposed in said electric power supply feeder line; and
    a second electric current supply circuit having a switching element, and interposed in said electric power return feeder line;
    wherein, the switching elements of said first and second electric current supply circuits are controlled to turn ON/OFF.

2. A device as set forth in claim 1 wherein each of said first and second electric current supply circuits comprise a constant-current circuit.

3. A device as set forth in claim 1 wherein said switching elements in said first and second electric current supply circuits comprise transistors.

4. A device as set forth in claim 2 wherein said switching elements in said first and second electric current supply circuits comprise transistors.

* * * * *